United States Patent [19]
Schiff

[11] Patent Number: 4,615,026
[45] Date of Patent: Sep. 30, 1986

[54] DIGITAL FIR FILTERS WITH ENHANCED TAP WEIGHT RESOLUTION

[75] Inventor: Leonard N. Schiff, Lawrenceville, N.J.

[73] Assignee: RCA Corporation, Princeton, N.J.

[21] Appl. No.: 572,442

[22] Filed: Jan. 20, 1984

[51] Int. Cl.$^4$ ............................................. G06F 15/31
[52] U.S. Cl. ...................................................... 364/724
[58] Field of Search ........................... 364/724; 333/166

[56] References Cited

U.S. PATENT DOCUMENTS

| | | | |
|---|---|---|---|
| 3,521,041 | 7/1970 | Blerkom et al. | 64/724 |
| 3,696,235 | 10/1972 | Tufts et al. | 364/724 |
| 3,979,701 | 9/1976 | Tomozawa | 333/166 |
| 4,062,060 | 12/1977 | Nussbaumer | 364/724 |
| 4,146,931 | 3/1979 | Delforge | 364/724 |
| 4,191,853 | 3/1980 | Piesinger | 179/1 SA |
| 4,323,864 | 4/1982 | Ogawa et al. | 333/165 |
| 4,344,149 | 8/1982 | van de Meebert et al. | 364/724 |
| 4,388,693 | 6/1983 | Nakayama | 364/724 |
| 4,484,299 | 11/1984 | Lambourn et al. | 364/724 |
| 4,524,423 | 6/1985 | Acampora | 364/724 |

OTHER PUBLICATIONS

Moon et al. "A Digital Filter Structure Requiring Only m-Bit Delays, Shifters, Inverters, and m-Bit Adders Plus Simple Logic Circuitry" IEEE Trans. on Ciruits and Systems, vol. CAS-27, No. 10, Oct. 1980, pp. 901–908.

Primary Examiner—David H. Malzahn
Attorney, Agent, or Firm—E. M. Whitacre; P. J. Rasmussen; E. P. Herrmann

[57] ABSTRACT

Output weighted FIR filters usually consist of a tapped delay line, weighting circuits coupled to the taps for weighting delayed samples and adder circuitry for combining the weighted samples. In designing such circuitry, tradeoffs are made between device complexity and the desired filter transfer function. FIR filters employing shift-and-add weighting circuits may have the resolution of their weighting circuits significantly enhanced with slight added circuit complexity by providing a parallel tapped delay line to which scaled input samples are applied. The scaled and non-scaled signal samples from the parallel tapped delay lines are both made available to the weighting circuits. The availability of both such samples for shifting and adding, nominally increases the number of possible weighting coefficients realizable from the weighting circuits more than two fold and thus, improves the design flexibility of the filter significantly.

6 Claims, 5 Drawing Figures

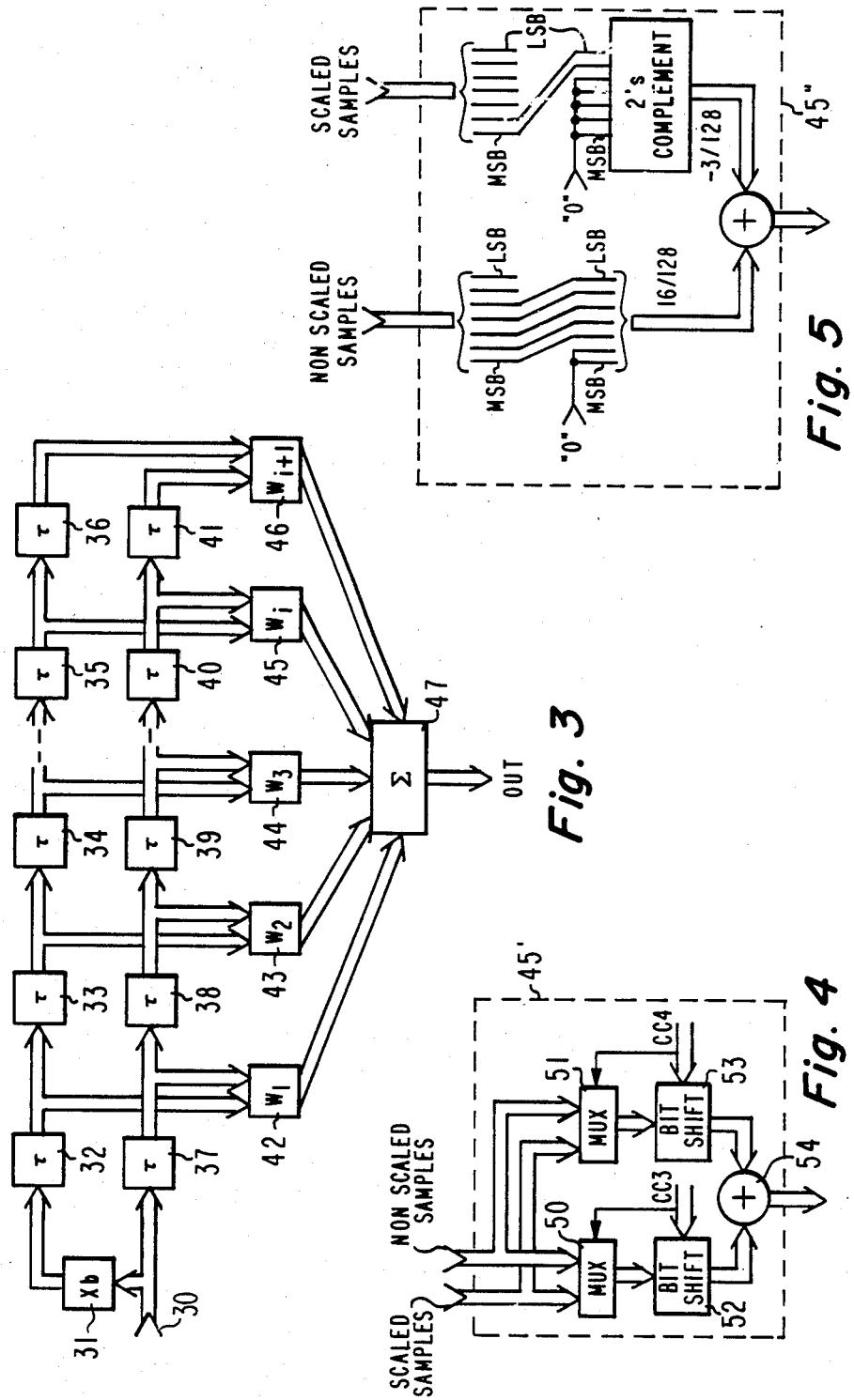

DIGITAL FIR FILTERS WITH ENHANCED TAP WEIGHT RESOLUTION

This invention relates to finite impulse response filters of the output-weighted or post-multiply type and more particularly to simplified apparatus for realizing sample weighting elements with enhanced resolution.

An output weighted finite impulse response (FIR) filter consists of cascaded delay stages with output taps at the different stages. Delayed signal samples from the different taps are applied to respective weighting circuits, and the weighted samples are summed to form respective filtered output samples from the filter.

There are two significant desirable criteria for digital filters: speed and simplicity. To achieve both speed and simplicity it is normally necessary to sacrifice the accuracy of the weighting coefficients. Simple and fast weighting circuits nominally consist of shift-and-add circuits. In the shift-and-add circuit the bit positions of the applied sample are shifted by, e.g. first and second numbers of bits to produce two samples weighted by reciprocal multiples of two. The two samples are then summed in an adder to produce the weighted sample. For example, the applied sample, $S_n$, may be bit shifted rightward by two and four bit positions to produce sample values $S_n/4$ and $S_n/16$ respectively. These samples are then added to produce the weighted sample having the value $5S_n/16$. The shift-and-add circuits may be cascaded to further refine the accuracy of the final weighting coefficient but at the expense of significant additional hardware. Note, however, that using a single shift-and-add circuit to realize a weighting element severely restricts the number of available weighting coefficients.

It is an object of the present invention to expand the available number of weighting coefficients produced by simple shift-and-add circuits without significantly increasing the hardware required to implement a FIR filter.

SUMMARY OF THE INVENTION

The present invention is directed to an arrangement of an output weighted digital FIR filter including first and second parallel tapped delay lines each including like numbers of stages and taps. Shift-and-add weighting circuits equal in number to the number of taps on either of the delay lines are respectively coupled to selected ones or both of the corresponding taps from each delay line. Weighted samples from the weighting circuits are added to produce the filtered output samples.

The signal to be filtered is applied directly to the input of the first tapped delay line. The signal to be filtered is also scaled and then applied to the input of the second tapped delay line. Each shift-and-add weighting circuit thus has available at its inputs a scaled and nonscaled delayed replica of the input signal for shifting and adding. The availability of the scaled and nonscaled signals significantly increases the number of possible weighting coefficients which may be realized from the shift-and-add circuit.

BRIEF DESCRIPTION OF THE DRAWINGS

FIGS. 2, 4 and 5 are block diagrams of shift-and-add weighting circuits;

FIG. 3 is a block diagram of an output weighted FIR filter in accordance with the principles of the present invention.

DETAILED DESCRIPTION

Figure 1:
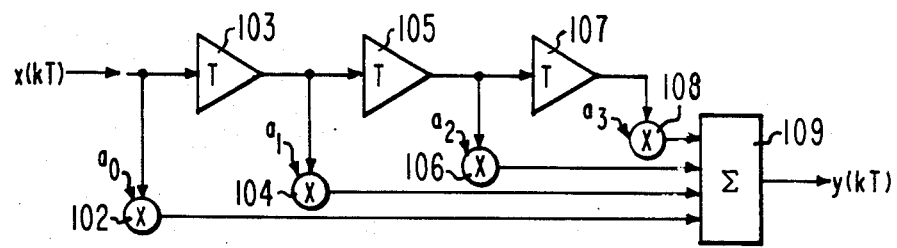
FIG. 1 is a block diagram of a prior art output-weighted FIR filter.

FIG. 1 shows a typical post-multiply or output weighted digital filter. The input to the digital filter consists of data samples taken once in each time period T. The samples are quantized into n-bit binary numbers. At any given time kT, the input to the digital filter is x(kT) and the output is y(kT). The input signal x(kT) is coupled to the input of a multiplier circuit 102 which multiplies the input by a coefficient $a_0$ to form the product $a_0x(kT)$. The input signal is also coupled to a delay element 103 which introduces a delay of T units so that the output of delay element 103 at time kT will be x(kT−T). In order to form the product $a_1x(kT−T)$, the input of multiplier 104 is coupled to the output of delay element 103. The output of delay element 103 is also coupled to the input of delay element 105, the output of which is coupled to the input of multiplier 106. The signal x(kT−2T) appears at the output of delay element 105 and the product $a_2x(kT−2T)$ appears at the output of multiplier 106. The output of delay element 105 is also coupled to the input of delay element 107, the output of which is coupled to the input of multiplier 108. Thus, the signal x(kT−3T) appears at the output of delay element 107 and the product $a_3x(kT−3T)$ appears at the output of multiplier 108. The output of each of the multipliers 102, 104, 106, 108 is coupled to one input of summing circuit 109, the output of which is the output y(kT) of the digital filter. Thus it is seen that the output of the digital filter represents the solution to a difference equation, $$y(kT) = a_0x(kT) + a_1x(kT-T) + a_2x(kT-2T) + a_3x(kT-3T). \quad (1)$$

The filter is referred to as a "post-multiply" digital filter because multiplication is performed after the signal has been delayed.

The speed and complexity of the digital filter will be determined primarily by the multipliers 102, 104, 106 and 108. The delay stages comprise a relatively small portion of the filter hardware.

Figure 2:
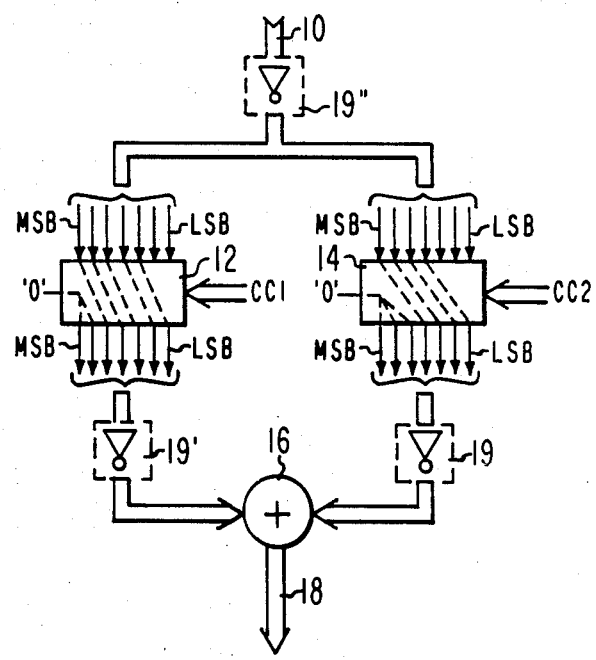

FIG. 2 illustrates a shift-and-add weighting circuit. Parallel bit input samples are applied on bus 10. These samples are directed to bit shifting elements 12 and 14. Responsive to coefficient control signals applied to control ports CC1 and CC2, shifters 12 and 14 translate the bit positions of the samples.

Depending upon the sophistication of shifters 12 and 14 the bits of the applied samples may be translated rightward or leftward, or leftward only or rightward only in accordance with the applied coefficient control signal. Rightward shifts effect a division by two for each bit position shifted. Leftward shifts effect a multiplication by two for each bit position shifted. Elements 12 and 14 may be barrel shifters and when used in the shift-and-add circuit permit changing of the coefficient values. Note, however, that if it is not desired to change the weighting coefficient, elements 12 and 14 may be eliminated and the bit shift performed by appropriate hardwiring.

It may be desirable to weight the applied sample by a negative coefficient in which instance sample complementing circuits (e.g. twos complement circuitry) may be interposed in the signal path. Such circuitry may be included at the input as illustrated by the box 19" drawn in dashed lines. Alternatively complementing circuits 19 and 19' may be serially connected at the output connections of shifter elements 12 and 14. Finally, only one or the other of the complementing circuits 19 or 19' may be included to provide a greater variety of coefficient values. For example, if samples passed by element 12 are not bit shifted and samples passed by element 14 are shifted four bit positions and complemented, the coefficient value is 1-1/16 or 15/16.

The samples output from shifters 12 and 14 are applied to first and second input ports of adder 16 which provides the weighted output samples at output port 18.

For simplicity of illustration consider the tap coefficients as being numbers from zero to one though negative coefficients and coefficients greater than one are realizable. The shift-and-add type of multiplier or weighting circuit produces tap weights of binary coefficients. The tap weights, t, may be represented by the equation:

$$t = \sum_{i=1}^{N} A_i 2^{-i} \quad (2)$$

where the $A_i$ equal zero or 1 and the number N is the maximum number of bit shifts permitted in the particular application. For the shift-and-add circuit of FIG. 2 only two at most of the $A_i$ are permitted to equal 1. Note, however, that if the FIG. 2 circuit is augmented with additional shift circuits which apply additional shifted samples to adder 16, then for each additional shifter, one more of the $A_i$ coefficients may equal 1.

Consider the circuit of FIG. 2 where at most two $A_i$ factors are equal to one and assume for illustration that the number N is equal to 5. The sample values from each of the shifter circuits 12 and 14 may therefore be weighted by the factors 0, 1, ½, ¼, ⅛, 1/16 and 1/32. The number of possible weighting coefficient values provided by the FIG. 2 arrangement corresponds to the number of unique sums that can be produced by all combinations of pairs of the above factors. For the FIG. 2 arrangement, there are 17 possible coefficients which are equal to the values 1/32×(0, 1, 2, 3, 4, 5, 6, 8, 9, 10, 12, 16, 17, 18, 20, 24, 32).

It is noted that the differences between certain successive coefficients is relatively large as for example between 24/32 and 32/32.

Consider next that both a delayed sample and a scaled version of the delayed sample is available to the shift-and-add circuit. In particular assume that the scaled version is scaled by the factor ¾ and that either the scaled or non-scaled sample may be applied to both shift circuits 12 and 14. The sample values available at the output ports of shift circuits 12 and 14 may therefore be weighted by the factors 0, 1, ½, ¼, ⅛, 1/16, 1/32, ¾, 3/16, 3/32, 3/64 and 3/128 (the latter 5 factors being the products of ¾×(½, ¼, ⅛, 1/16 and 1/32). The number of weighting coefficients provided by this arrangement is equal to the number of unique sums of all combinations of pairs of these factors and is equal to 44. The resulting coefficients include 1/128×(0, 3, 4, 6, 7, 8, 9, 10, 11, 12, 14, 15, 16, 18, 19, 20, 22, 24, 27, 28, 30, 32, 35, 36, 38, 40, 44, 48, 51, 52, 54, 56, 60, 64, 67, 68, 70, 72, 76, 80, 88, 96, 112, 128). Note that in both examples if the bit shifters may produce both positive and negative values, the number of possible positive coefficients expands slightly.

The number of possible coefficients depends upon the scale factor chosen. For example, if a scale factor of ⅝ is used the number of coefficients increases to 50. The availability of large numbers of possible coefficient values realizable with simple shift-and-add weighting circuits of the type illustrated in FIG. 2 enables the designer to synthesize relatively simple, fast FIR filters for a relatively wide range of transfer functions with good precision.

FIG. 3 illustrates an exemplary FIR filter having facility for applying both a scaled and an unscaled sample to the respective weighting circuits W. In the figure, signal samples to be weighted are applied at input port 30. These samples are applied to the cascade connected delay stages 37–41 each of which has an output tap from which successively delayed signal samples are accessed. Input signal samples at port 30 are also applied to scaling circuit 31, which may be a shift-and-add weighting circuit, and which multiplies the samples applied thereto by a scale factor. Scaled signal samples from scaling circuit 31 are applied to the cascade connected delay stages 32–36. Delay stages 32–36 are similar to stages 37–41, and have respective output taps from which successively delayed signal samples may be accessed. Scaled samples from respective delay stages 32–36 and non-scaled samples from respective corresponding delay stages 37–41 are applied to respective weighting circuits 42–46. Weighting circuits W, which may be shift-and-add circuits, responsive to selected ones of the scaled and non-scaled delayed samples, provide weighted representations of the delayed input samples. The weighted samples from weighting circuits 42–46 are applied to the adder circuit 47 which sums the weighted delayed samples to produce filtered replicas of the input samples.

FIG. 4 illustrates an exemplary weighting circuit 45' which may be employed in the FIG. 3 filter. The weighting circuit 45' is of the shift-and-add type and includes facility for programming the weighting coefficient via control signals applied to coefficient control input ports CC3 and CC4. The FIG. 4 circuit is similar in form and function to that of FIG. 2 in that it includes bit shifters 52 and 53 for performing binary weighting of the applied samples and an adder 54 to sum the binary weighted samples. FIG. 4, however, includes first and second multiplexors 50 and 51 for applying one or the other of the scaled or non-scaled delayed input samples to either or both of the bit shifters 52 and 53 respectively. Weighting circuit 45' can be arranged to produce, for example, a weighting of the input samples by any of the 44 coefficients listed in the second example. Note, complementing circuits may be included in the FIG. 4 apparatus to provide negative coefficients in an arrangement similar to that utilized in FIG. 2.

FIG. 5 illustrates a hardwired version of the FIG. 4 weighting circuit arranged to weight the input signals to be filtered by the coefficient 13/128 for the input samples scaled by the factor of ¾. In the hardwired version both the multiplexors and the programmable bit shifters are unnecessary.

The illustrated circuitry is described in terms of simple shift-and-add circuitry, however, it will be appreciated that the shift-and-add circuits may be augmented with additional bit shifters and adders in an adder-tree like arrangement to further increase the number of possible weighting coefficients. In addition, the input scaling circuit may be designed to scale the input samples by negative factors or to selectively scale successive samples by different factors. Further, it may be necessary to include compensating delay in the non-scaled delay chain to accommodate the inherent delay of the scaling circuit.

What is claimed is:

1. A finite impulse response filter comprising:
   a source of digital input signal samples;
   a first tapped delay line having an input port coupled to said source and a plurality of output ports at which successively delayed signal samples are available;
   a signal scaling circuit having an input port coupled to said source and having an output port;
   a second tapped delay line having an input port coupled to said scaling circuit and having a plurality of output ports at which successively delayed scaled signal samples are available;
   a plurality of weighting circuits respectively coupled to said output ports, for producing representations of said input signal samples weighted by respective coefficient values, at least one of said weighting circuits being coupled to receive both scaled and non-scaled samples equally delayed from signal samples at said source, said at least one weighting circuit utilizing both said scaled and non-scaled samples to produce a weighted sample; and
   means for summing weighted samples from said plurality of weighting circuits including said at least one of said weighting circuits for producing filtered samples representative of said input signal samples.

2. The filter set forth in claim 1 wherein said at least one weighting circuit includes means for changing the value of the weighting coefficient.

3. The filter set forth in claim 2 wherein said at least one weighting circuit includes:
   a summing circuit including first and second input ports, and an output port at which weighted samples are available;
   first and second bit shifters including respective output terminals coupled to the first and second input ports respectively of said summing circuit, including respective input ports, and including respective control signal input ports for applying shift control signals, said first and second bit shifters being responsive to said shift control signals to weight signal samples applied thereto by values corresponding to said shift control signals, and wherein said shift control signals correspond to said coefficient values;
   respective means for coupling the input ports of said first and second bit shifters to respective output ports of said first and second tapped delay lines.

4. The filter set forth in claim 3 wherein said at least one weighting circuit further includes means, serially coupled between said summing circuit and at least one of the output ports of said first and second delay lines for inverting the polarity of samples.

5. The filter set forth in claim 1 wherein said at least one weighting circuit includes bit shift-and-add circuitry for producing said weighted samples.

6. The filter set forth in claim 5 wherein said bit shift circuitry comprises hardwired connections for translating bit positions of samples available from said taps to different bit positions.

* * * * *